United States Patent [19]

Koen et al.

[11] Patent Number: 5,407,501
[45] Date of Patent: Apr. 18, 1995

[54] METHOD OF MANUFACTURE OF PRESSURE SENSOR HAVING A LAMINATED SUBSTRATE

[75] Inventors: Edward F. Koen, Danville, Calif.; Robert D. Vernon, Norfolk, Mass.

[73] Assignee: The Foxboro Company, Foxboro, Mass.

[21] Appl. No.: 150,838

[22] Filed: Nov. 12, 1993

Related U.S. Application Data

[62] Division of Ser. No. 825,620, Jan. 24, 1992, Pat. No. 5,285,690.

[51] Int. Cl.⁶ .......................... G01L 9/06; B32B 31/00
[52] U.S. Cl. ..................................... 156/64; 29/621.1; 156/89; 156/292
[58] Field of Search ................. 73/727, 721, 720, 726, 73/756; 156/64, 89, 292, 150, 151; 29/621.1

[56] References Cited

U.S. PATENT DOCUMENTS

| | | | |
|---|---|---|---|
| 4,612,227 | 9/1986 | Lam et al. | 428/137 |
| 4,658,651 | 4/1987 | Le | 73/721 |
| 4,726,233 | 2/1988 | Eckart et al. | 73/727 |
| 4,802,952 | 2/1989 | Kobori et al. | 29/621.1 |
| 4,888,992 | 12/1989 | Mathias et al. | 73/721 |
| 4,972,716 | 11/1990 | Tobita et al. | 73/721 |
| 5,056,369 | 10/1991 | Tamai et al. | 73/718 |
| 5,133,215 | 7/1992 | Lane, III et al. | 73/721 |
| 5,142,912 | 9/1992 | Frische | 73/727 |
| 5,209,120 | 5/1993 | Araki | 73/727 |
| 5,257,546 | 11/1993 | Tobita et al. | 73/727 |

FOREIGN PATENT DOCUMENTS

| | | |
|---|---|---|
| 0312197 | 4/1989 | European Pat. Off. . |
| 0317664 | 5/1989 | European Pat. Off. . |
| 0334611 | 9/1989 | European Pat. Off. . |
| 2027988 | 2/1980 | United Kingdom . |

*Primary Examiner*—Michael W. Ball
*Assistant Examiner*—Sam Chuan Yao
*Attorney, Agent, or Firm*—Lahive & Cockfield

[57] ABSTRACT

A pressure sensor sub-assembly (18) has a solid-state sensing element (22) mounted on a laminated ceramic substrate (20) and has the electrical signal contacts (22a) on the sensing element electrically connected to connector pins (24) on the substrate. A manufacturing process can fabricate a batch of sub-assemblies on a substrate structure that is sub-divided to form the separate sub-assemblies. The sensor sub-assemblies can be tested, and graded, before or after the sub-division step, and then each mounted in a housing.

6 Claims, 5 Drawing Sheets

METHOD OF MANUFACTURE OF PRESSURE SENSOR HAVING A LAMINATED SUBSTRATE

This application is a divisional of application Ser. No. 07/825,620, filed on Jan. 24, 1992, now U.S. Pat. No. 5,285,690 the contents of which are expressly incorporated.

Background

This invention relates to apparatus and manufacturing methods for pressure sensors that employ pressure-sensitive diaphragms. It relates in particular to apparatus and assembly methods, including mechanical and electrical features, for a discrete sensor sub-assembly having a solid-state sensing element that includes the sensing diaphragm. The sub-assembly provides a minimal configuration for testing the electrical response of the diaphragm to pressure variations, before assembly within a housing.

Typical solid-state pressure sensing elements mount a thin silicon diaphragm above an open chamber. Pressure variations cause the diaphragm to deflect into and out of the chamber. The deflections cause changes in an electrical parameter, typically capacitance or resistance, that can be measured and converted into pressure-responsive information.

The use of solid-state pressure sensing elements in hostile work environments typically requires a housing that surrounds and protects the sensing element from direct contact with the fluid being measured. One conventional housing has a metal base covered with a flexible isolation diaphragm that separates the sensing diaphragm from the fluid being measured, and that deflects with the changing pressure of the fluid. A non-corrosive, inert fill fluid is within the housing, between the isolation diaphragm and the sensing diaphragm, and transmits the pressure being measured to the sensing diaphragm. Electrical leads carrying signals from the sensing element to external contacts of the pressure sensor pass through an hermetic seal to exit from the housing. This seal is typically achieved separately for each contact with a glass-to-metal bond through the metal base.

The sensing element conventionally is tested after assembly within the housing. This results in needless expense of materials and labor, if the testing reveals a defect, for example, in the sensing element or the connections to it.

It accordingly is an object of this invention to provide an improved apparatus and manufacturing method for diaphragm pressure sensor devices, including a low cost testable format.

It is a further object of the invention to provide an improved method and apparatus for the low-cost manufacture of a silicon-diaphragm pressure sensor having superior performance.

Another object of the invention is to provide pressure sensor apparatus, and a manufacturing method for the apparatus, that employ a solid-state sensing element and that operates with minimal spurious signal artifacts due to mechanical disturbance, e.g., from distortion or other unwanted stress, of the sensing element.

Other objects of the invention will be apparent from the following description.

SUMMARY OF THE INVENTION

A pressure sensor sub-assembly according to the invention has a laminated substrate to which a solid state sensing element is secured. The sensing element has a sensing diaphragm, and either side of the sensing element can be stimulated by a pressure that is to be tested relative to the pressure on the other side. In a typical configuration, a pressure passage through the substrate communicates with a chamber on one side of the diaphragm of the sensing element.

The substrate preferably is a laminate of at least two layers of ceramic. Each ceramic layer is apertured to form holes for electrical connections and for the pressure passage, and electrical conductors are formed in the holes to provide sealed electrical feed-through connections. The resultant layers are stacked and bonded together. Electrical connection pins, for external connection to the sensing element, are attached to the substrate and connected with the conductors formed in the holes.

The solid-state sensing element is mounted to the substrate by a compliant adhesive applied on the substrate with controlled thickness and topography. Electrical connections are wired between contacts on the sensing element and, by way of the conductors in the holes in the substrate, the connection pins. A circuit element for measuring the diaphragm deflection by capacitive or resistive, e.g. piezo-resistive, techniques is typically provided on the sensing element.

At this stage of manufacture and with this structure, the sensor sub-assembly of the substrate and the sensing element is ready for functional testing. This includes testing the electrical response of the sensing element under different pressure conditions. The sensor sub-assembly can be sold as is, or used in various pressure sensing applications.

In further accord with the invention, the foregoing fabrication sequence and structure can be provided concurrently for a large number of sensor sub-assemblies by using, for each layer of the substrate, a sheet of ceramic sufficiently large to form one layer for the multiple sub-assemblies. The apertured ceramic sheets, with electrical conductors filling the holes, are stacked to form the laminated substrate. One preferred practice forms this laminated assemblage with green ceramic sheets. The laminate is scored to define each separate sensing element, and fired to form a monolithic structure. The connection pins are attached, the silicon sensing elements are mounted with the applied adhesive, and the connections are wired to complete the concurrent assembly of the multiple sensor sub-assemblies.

The laminated substrate structure can be kept intact to this stage of fabrication and for the testing of each sensor sub-assembly, and can then be subdivided to separate the sensor sub-assemblies into individual units.

Alternatively, the substrate structure can be subdivided into separate sensor sub-assemblies at an earlier stage, generally subsequent to firing and illustratively after the adhesive mounting of the solid-state sensing elements to the substrate.

Each separated and tested sensor sub-assembly typically is assembled into a housing, which conventionally has a metal base. The connection pins carried on the substrate are accessible externally of the housing through the metal base, by way of apertures through the base, for connecting the sensor sub-assembly to further electrical equipment external to the housing. The sealant that mounts the sensor sub-assembly forms a hermetic seal between the substrate and the housing base. An isolation diaphragm typically closes the housing, after a fill fluid is introduced, for coupling pressures external to the isolation diaphragm to the sensing element within the housing.

This structure and assembly procedure attains diaphragm-type pressure sensor sub-assemblies that can be tested before final assembly into a housing. Further, the structure and procedure can be advantageously used to manufacture an array of many sensor sub-assemblies elements concurrently. The invention thus enables pressure sensor sub-assemblies to be fabricated at low cost, and yet have high performance operation. The resultant pressure sensor sub-assemblies further are readily given final assembly into pressure-tight housings, without the costly and fragile glass-to-metal seals of prior structures, to form completely housed sensors.

A further feature of the invention is that the mounting of the solid-state sensing element to the ceramic substrate, by the compliant adhesive, both provides a hermetic seal and isolates the sensing element substantially from mechanical disturbance, such as distortion or other stress, of the substrate. This isolation of mechanical disturbance minimizes erroneous signals from the sensing element.

Another advantage the invention provides for a pressure sensor sub-assembly is that both the solid-state sensing element and the substrate on which it is mounted can be of similar if not identical materials and hence can have similar if not identical coefficients of thermal expansion. In one example, each is of silicon. As a result, there is little if any differential thermal expansion/contraction between the substrate and the sensing element.

BRIEF DESCRIPTION OF DRAWINGS

For a fuller understanding of the nature and objects of the invention, reference should be made to the following detailed description and the accompanying drawings, in which.

DESCRIPTION OF ILLUSTRATED EMBODIMENTS

Figure 1:
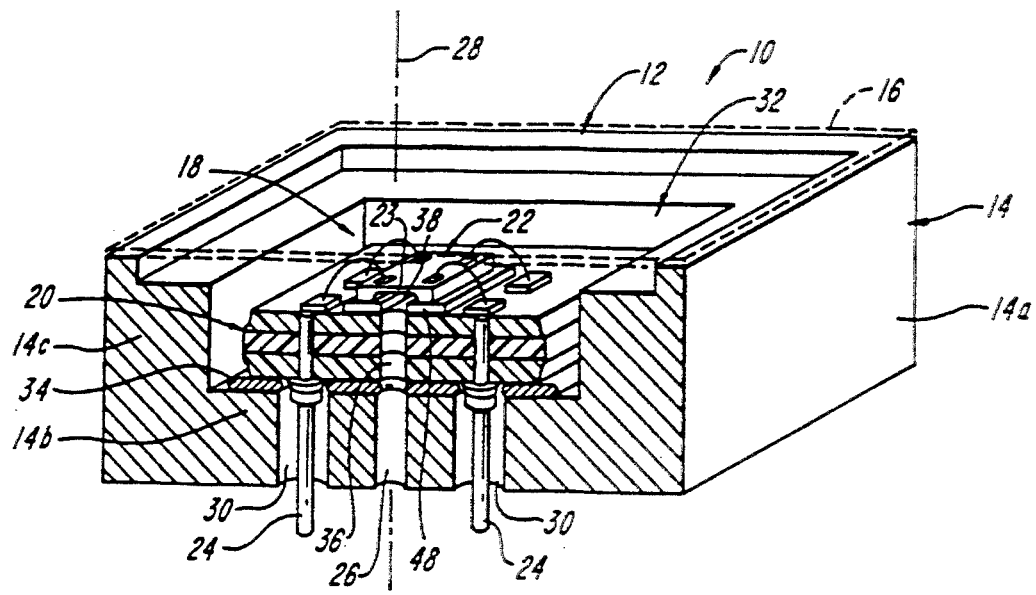
FIG. 1 is a perspective view, partly cut away, of a pressure sensor according to one embodiment of the invention.

A pressure sensor 10 according to the invention, as shown in FIG. 1, has an outer housing 12 formed with a body 14. The body 14 is closed with an isolation diaphragm 16 and contains a pressure sensor sub-assembly 18. The illustrated sensor sub-assembly 18 has a ceramic substrate 20 on which is mounted a solid-state sensing element 22 that has a sensing diaphragm 23. The sensor sub-assembly 18 has electrical connector pins 24 projecting from the substrate 20 for external electrical connection.

The illustrated housing body 14 is apertured with a pressure passage 26 that forms a fluid connection to the underside of the diaphragm 23. The housing body is also apertured with multiple apertures 30, parallel to center line 28, through which the connector pins 24 pass. The housing body 14 has a lower bulkhead floor 14b and sidewalls 14c that form an interior fill cavity 32 that is preferably centered on the axis of the pressure passage 26.

The sensor sub-assembly 18 is mounted with an adhesive sealant 34 to the flat interior surface of the bulkhead floor of the housing body. The electrical connector pins 24 project through that floor within the connector apertures 30. The pins 24 are centered within the apertures 30 to be isolated electrically from the walls of the apertures; insulating sleeves over the pins or other means can also be provided to ensure electrical isolation. The sensor sub-assembly 18 thus spans the pressure passage 26 and the connector apertures 30 that extend through the bulkhead floor 14b. Further, the sealant 34 hermetically seals the sub-assembly 18 to the bulkhead floor.

FIG. 1 further shows that a sensor pressure passage 36 extends through the sensor substrate 20. This passage allows fluid communication between the pressure passage 26 through the housing and a fluid chamber 38 formed by solid state sensing element 22.

The side walls 14c of the housing body 14, in combination, form a fill cavity 32 above the housing floor 14b. The walls further define a sealing rim to which the isolation diaphragm 16 is sealingly secured. An inert pressure communicating fluid (not shown) fills the cavity 32 to couple to the diaphragm 23 of the sensing element 22 external pressure exerted on the isolation diaphragm 16. The diaphragm 23 of the sensing element 22 thus deflects according to the difference in pressure between the pressure applied to the isolation diaphragm 16 and the pressure in the chamber 38.

In the embodiment shown in FIG. 1, the sensor 10 may be used to measure either differential pressure or gage pressure. In the case where differential pressure is to be measured, a second pressure is applied to the diaphragm 23 through the pressure passages 26 and 36. In one case where gage pressure is to be measured, the passages 26 and 36 are left open to the atmosphere. Finally, if the passages 26 and 36 are sealed or eliminated, the device can be used to measure absolute pressure applied to the isolation diaphragm and coupled by the fill fluid to the top of the pressure sensing element 22.

Figure 2:
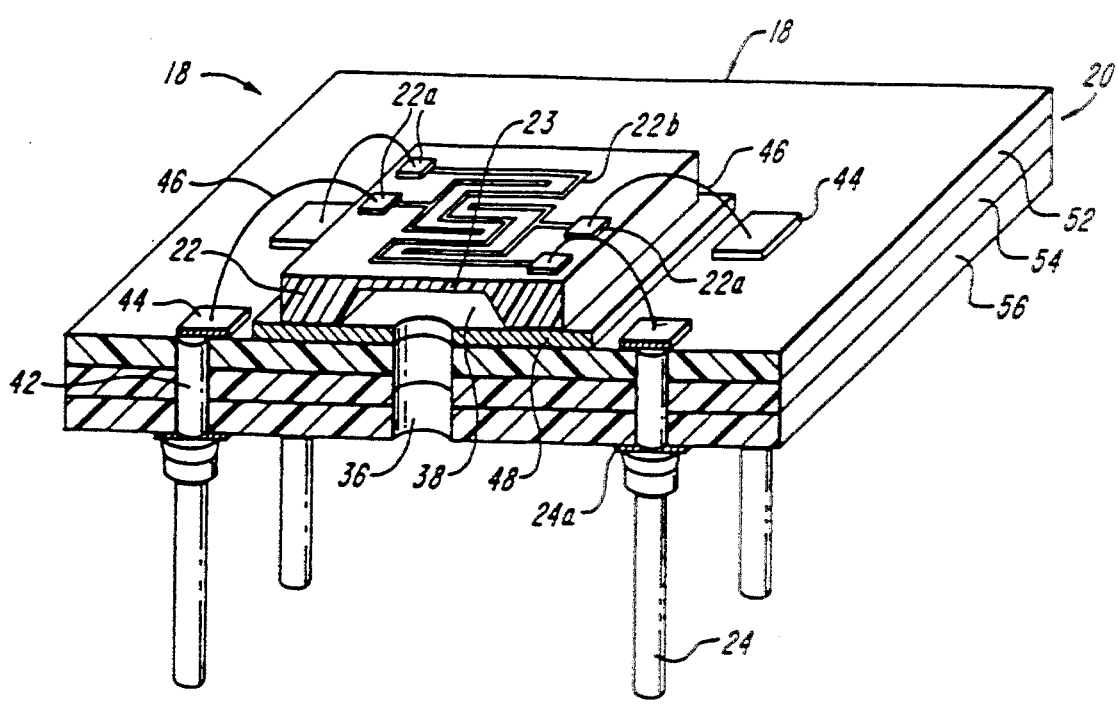
FIG. 2 is a perspective view of the sensor sub-assembly of the sensor of FIG. 1.

FIG. 2, which is an enlarged view of the sensor sub-assembly 18, shows that the illustrated sub-assembly 18 has the solid state sensing element 22 mounted on an upper surface of the ceramic substrate 20. Electrical conductors 42 formed by metal-filled holes extend between the upper and lower surfaces of the substrate 20 and interconnect via conductive pads 24a the connector pins 24, which project from the lower surface of the substrate 20, with conductive lands 44 formed on the substrate upper surface. Conductive wires or metallic fingers 46 are bonded between the lands 44 and the contacts 22a on the upper surface of the solid state sensing element. With these electrical connections, the sensing element 22 can be interconnected by way of the pins 24 to electronic data acquisition instruments or other electrical equipment. A layer 48 of bonding material, typically a compliant adhesive, bonds and seals the sensing element 22 to the substrate 20.

The pressure passage 36 extends through the layer 48 of bonding material to communicate with the chamber 38 that the solid-state sensing element 22 forms. With further reference to FIG. 2, the illustrated sensing element 22 is an inverted box-like silicon structure with continuous peripheral walls, the edges of which are bonded to the substrate 20 by way of the adhesive bonding layer 48 for mechanical mounting and hermetic sealing. The central span of the sensing member, i.e., the base of the box-like structure, is of reduced thickness to form the pressure-responsive diaphragm 23. The chamber 38 is thus defined by the box-like structure and is sealed by way of the bonding adhesive layer 48 from the pressure in the fill cavity 32 (FIG. 1).

The illustrated sensing element 22 has on the upper surface of the central portion, i.e., on the diaphragm 23 which it forms, electrical elements 22b that can be used to detect the pressure responsive deflection of the diaphragm 23. The electrical elements 22b can be one or more conductive films that form one or more capacitor plates or, alternatively, can be piezo-resistive. The electrical elements are connected to the contacts 22a on the sensing element.

Figure 3A:
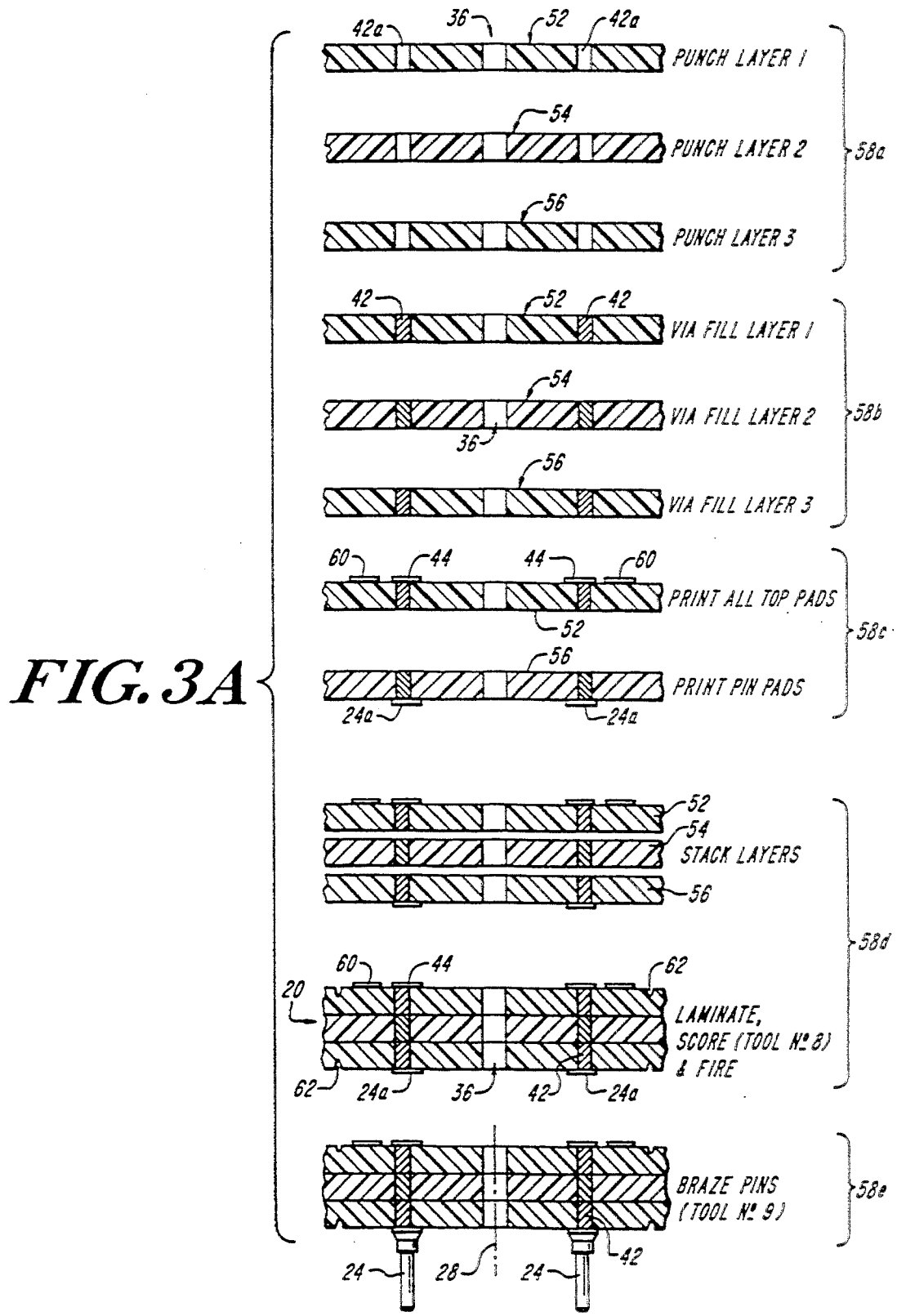
FIGS. 3A and 3B show successive stages in the fabrication and testing of the sensor sub-assemblies of FIG. 2 in accordance with features of the invention.
Figure 3B:
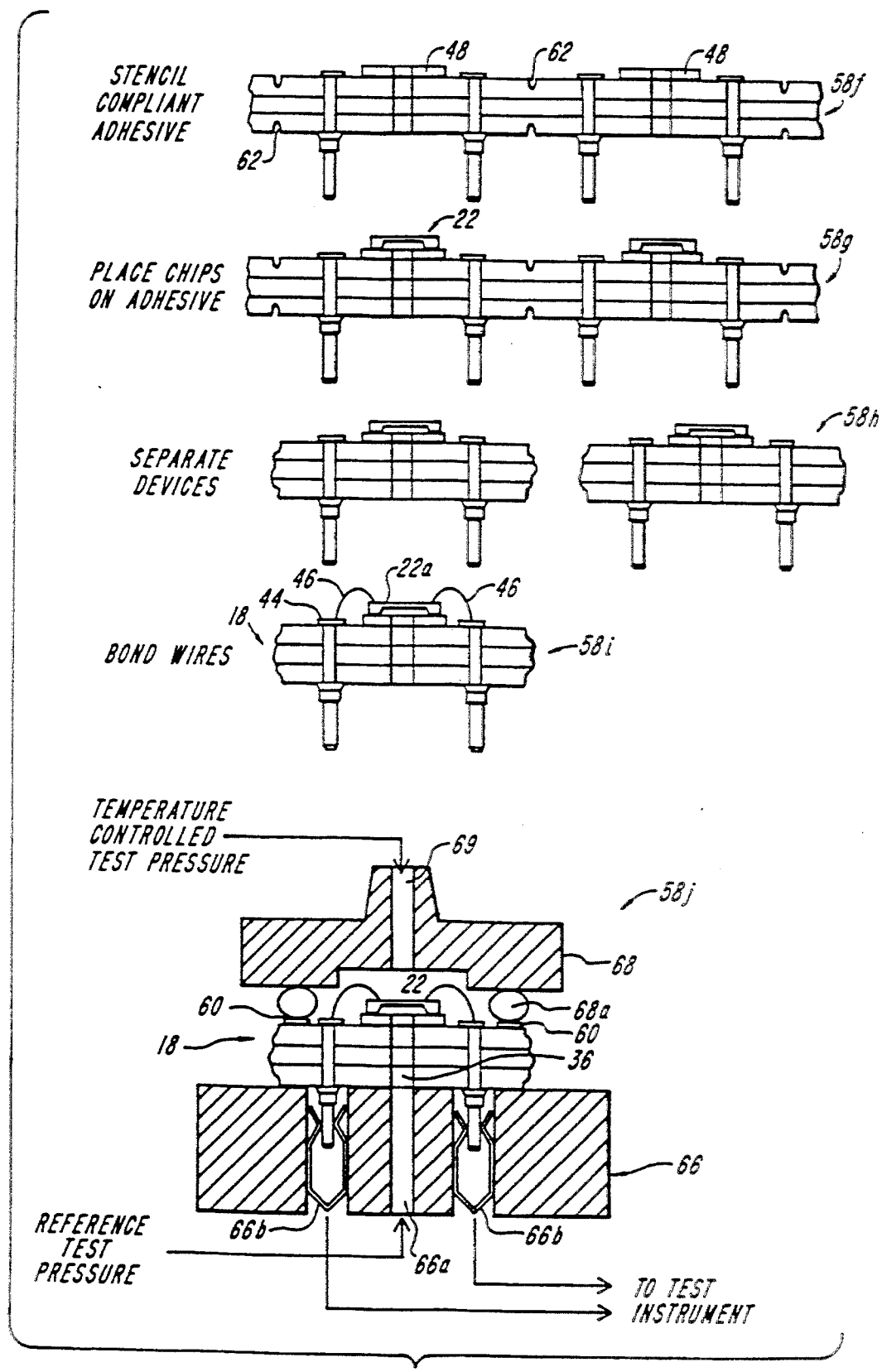

FIGS. 3A and 3B illustrate sequential steps of a process according to the invention for fabricating the sensor sub-assembly 18 of FIGS. 1 and 2 with a substrate 20 that is a laminate of three layers 52, 54 and 56. The first illustrated step 58a fabricates each substrate layer 52, 54 and 56 from unfired, i.e., green, ceramic sheet material. Each layer is punched to form apertures to form sensor pressure passage 36 and to form apertures 42a within which the electrical conductors 42 are subsequently formed.

In step 58b, the electrical connection apertures 42a are filled with conductive material, typically refractory metal ink, to form portions of the conductors 42. In a step 58c, the conductive lands 44 are formed, as by silk screening, on the upper surface of the upper layer 52. Also, conductive pads 24a for subsequent connection to the connector pins 24 are formed, again preferably by silk screening, on the lower surface of the lower layer 56. The illustrated step 58c includes depositing an optional conductive sealing pad 60 on the top surface of the upper layer 52 as a continuous path peripherally outward of the lands 44. This optional sealing pad 60 is engaged by a test fixture as described below with reference to the illustrated step 58j.

With further reference to FIG. 3A, a subsequent step 58d involves stacking the green ceramic layers 52, 54 and 56, with the openings in register with one another. The layers are then laminated together and fired under heat and pressure to form a single unitary structure and to bond the conductive ink segments into continuous electrical conductors 42. Before the ceramic layers are bonded and fired in this manner, the illustrated fabrication of the ceramic substrate 20 includes forming grooves or score lines 62 into the bottom and the top surfaces of the substrate. The grooves or score lines define the geometry of each individual discrete sensor sub-assembly into which the bonded sheets will subsequently be separated.

In a subsequent step 58e, the electrical connector pins 24 are secured to the bottom surface of the substrate 20 by brazing them to the conductive pads 24a. The connecter pins are thus assembled to extend parallel to the axis 28, for functioning as male connecter pins for mechanical and electrical engagement with corresponding female contacts.

FIG. 3B shows that in step 58f a compliant adhesive is deposited, preferably by stenciling, on the upper surface of each substrate 20 to form the bonding layer 48.

In the next fabrication step 58g, the solid-state sensing element 22 is positioned on each substrate and pressed in place on the adhesive bonding layer 48. The adherent mounting bond, which the adhesive layer 48 forms between the substrate 20 and the sensing element 22, is a pressure-tight and hermetic seal. The adhesive bond is, however, sufficiently resiliently compliant to decouple the sensing element 22 from stress in or deformation of the substrate 20. This stress isolation of the sensing element is important to avoid producing spurious signals due to unwanted distortion or stress of the diaphragm 23.

At this stage in the illustrated process, the batch of sensor sub-assemblies formed on the fired ceramic substrate is separated into discrete units, in step 58h. In a subsequent step 58i, the conductive wires 46 are bonded to the sensing element contacts 22a and to the substrate lands 44. The structural fabrication of each pressure sensor sub-assembly 18 is now complete.

In the illustrated next step 58j, each sensor sub-assembly 18 is subjected to functional testing of the electrical output signals it produces in response to selected pressure conditions. In the test illustrated, the sensor sub-assembly 18 is seated on a lower test fixture 66. The test fixture 66 has a pressure aperture 66a in fluid communication with the sensor pressure passage 36 and which is connected to a reference test pressure, which can be the ambient pressure. The fixture 66 also has electrical receptacles 66b that connect with the connector pins 24 on the sensor sub-assembly 18 and that are connected to external test instrumentation.

As also shown in FIG. 3B in step 58j, an upper test fixture 68 engages the top of the ceramic substrate 20 of the sensor sub-assembly 18 with an O-ring-like seal 68a at the conductive sealing pad 60. The upper test fixture 68 receives a sequence of selected temperature controlled test pressures by way of a passage 69, and applies it to the top of the substrate and to the upper, outer surface of the sensing element 22.

The two test fixtures 66 and 68 shown in step 58j can thus subject the diaphragm 23 of the pressure sensor sub-assembly 18 to selected differential pressures and temperatures, and the electrical response of the sub-assembly is monitored by the test instrumentation connected by way of the test fixture contacts 66b. This testing of the pressure sensor sub-assembly 18 is performed prior to the costly further steps of mounting it in the housing 12, as described above with reference to FIG. 1. A sensor sub-assembly 18 determined to be faulty or defective in the testing of step 58j can be discarded or reworked. Further, the sensor sub-assemblies can be classified according to actual measured performance, e.g. sensitivity, and may be installed in different housings accordingly.

The further assembly of a successfully tested sensor sub-assembly 18 into the housing 12 of FIG. 1 proceeds with the steps of applying the sealant 34 to the housing base 14, and mountingly bonding the sensor sub-assembly 18 onto the sealant, with the sensor pressure passage 36 in communication with the housing pressure passage 26 and with the connection pins 24 freely passing through the connector apertures 30.

The interior cavity 32 of the structure is then filled with the incompressible fill liquid, and the isolation diaphragm 16 is secured in place. This completes the fabrication of the sensor 10.

The sequence of certain steps in the foregoing fabrication process can be changed, as will be understood by those skilled in the art of fabricating hermetic packages for electrical semiconductor integrated circuits with green ceramic sheets. For example, the separation of the multiple sensor sub-assemblies into separate devices, illustrated at step 58h, can be performed at different points in the assembly process. As further examples, the bonding wires 46 can be installed and/or the functional testing can be performed before the separation step.

Figure 4:
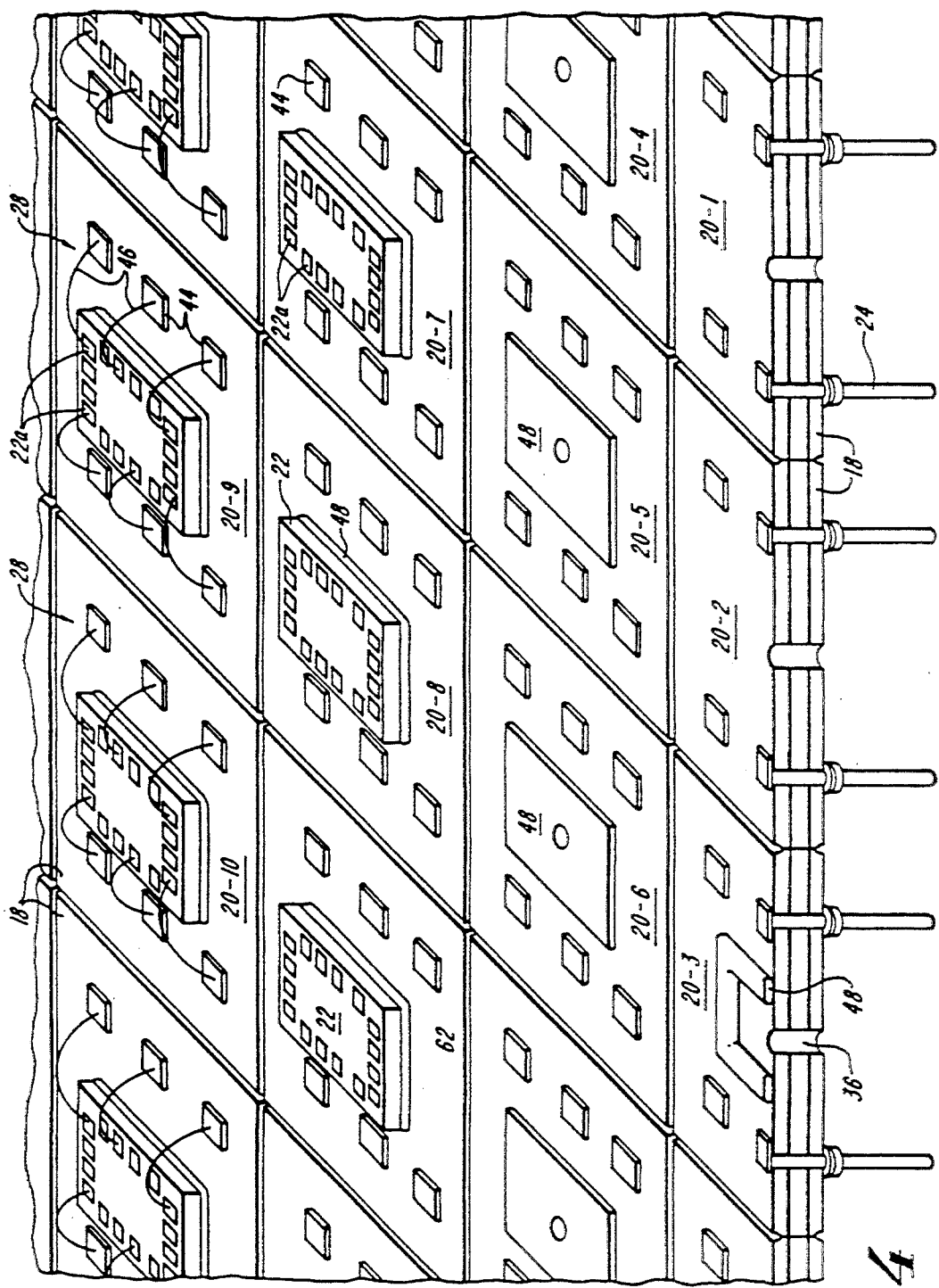
FIG. 4 is a perspective showing of the concurrent fabrication of multiple sensor sub-assemblies—illustrated in different stages of fabrication—in accordance with FIGS. 2 and 3.

FIG. 4 summarizes selected steps of the foregoing fabrication of FIGS. 3A and 3B by showing different successive stages in the concurrent fabrication of multiple sensor sub-assemblies 18 on a single stack of laminated ceramic sheets. The illustration in FIG. 4, with different sensor sub-assemblies 18 in different stages of fabrication, is hypothetical; in a typical actual practice all the sensor sub-assemblies 18 being fabricated on a single substrate structure are processed alike and hence are all at the same stage of fabrication at any given time. In particular, the substrate sections 20-1 and 20-2 of FIG. 4 have completed fabrication step 58e of FIG. 3A, and accordingly, each substrate is laminated and has the connection pins 24 mounted thereon.

Substrate sections 20-4, 20-5 and 20-6 illustrate a fabrication in which the adhesive layer 48 is applied by a silk screen or stencil operation, in accord with step 58f. In both this instance and in the instance of substrate section 20-3, the adhesive layer is confined to a selected configuration encircling the opening of the sensor pressure passage 36. This, however, is generally not necessary because a small applied pressure will re-open the pressure passage 36 by removing any film of adhesive that might cover it after application by silk screen or stencil.

An alternative application of the adhesive layer 48 is illustrated on the substrate section 20-3, which has a layer 48 of adhesive dispensed on it in the desired configuration to keep the passage 36 open.

The substrate sections 20-7 and 20-8 show the fabrication at the completion of step 58h, with the solid-state sensing element 22 bonded in place, by way of the adhesive layer 48, to the substrate structure. The further substrate sections 20-9 and 20-10 in FIG. 4 show the assembly upon completion of step 58i, with the conductive wires, 46 bonded between the conductive lands 44 on the substrate sections and the electrical contacts 22a of the sensing elements.

FIG. 4 also shows the grooves 62 that are scored into the ceramic substrate structure, preferably after lamination and before firing, to facilitate the subsequent separation of the separate sensor sub-assemblies 20.

Figure 5:
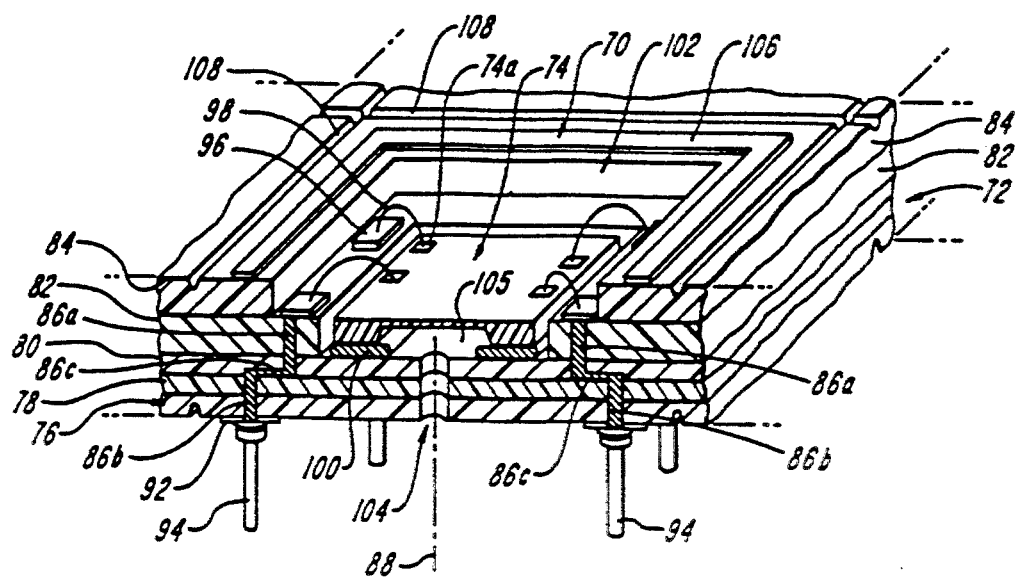
FIG. 5 is a perspective view, partly cut away, of another embodiment of the invention in which a sensor sub-assembly is inset into a ceramic substrate.

FIG. 5 shows another pressure sensor sub-assembly 70 according to the invention that has a multiple-layer tiered substrate 72 that forms a floor and elevated side walls that form a recessed well 102. A solid-state sensing element 74 is secured on the floor and seated within the recessed well.

The illustrated substrate 72 has five ceramic layers, namely three layers 76, 78 and 80 of essentially identical rectangular shape and the central portions of which form the floor on which the sensing element 74 is mounted; and two upper layers 82 and 84. The upper substrate layers 82 and 84 have the same outer dimensions as the lower substrate layers, and each has a central rectangular opening. Each upper layer thus extends peripherally about the mounted sensing element 74 and forms the tiered walls of the recessed well. The central opening illustrated in the uppermost substrate layer 84 is larger than the opening in the upper layer at 82, to form an outwardly stepped or tiered recessed well.

As further shown in FIG. 5, the ceramic substrate 72 has electrical conductors 86 extending between the substrate bottom surface, i.e., the bottom surface of the lower layer 76, and the upper surface of the first tiered layer 82. These electrical conductors 86 extend within holes through the substrate layers 76, 78, 80 and 82. As further illustrated by way of example, each illustrated conductor 86 follows two non-aligned paths 86a and 86b through the substrate. The path 86b is offset laterally outwardly from the path 86a, relative to the central recessed well 102. A laterally extending conductor path 86c electrically interconnects the two offset segments of each conductor. This arrangement of the conductors, on different paths through the substrate, enables the upper and lower connections to the substrate to be located independently of one another.

Conductive lands 92 are plated on the lower surface of the substrate 72 and in contact with the conductors 86. An externally accessible male connector pin 94 is mounted to the substrate 72 in electrical contact with each land 92, suitably by brazing. Further conductive lands 96 are plated on the upper surface of the substrate layer 82, each in electrical contact with the upper end of a conductor 86 and openly accessible on the exposed step-like upper surface of that substrate layer. Electrical wires 98 are bonded between the lands 96 and contacts 74a on the sensing element 74, for electrically connecting a piezo-resistive or capacitive circuit element (not shown) on the sensing element 74 with the connector pins 94.

The solid-state sensing element 74 can be identical to the one described with reference to FIGS. 1 through 4 and bonded to the platform of the substrate 72 by way of a layer 100 of compliant mounting adhesive. A chamber 105 defined between the central recess of the sensing element 74 and the substrate floor is in fluid communication with a pressure passage 104 through the substrate layers 76, 78 and 80, typically along the centerline 88 as shown.

The pressure sensor sub-assembly 70 of FIG. 5 is preferably fabricated in a manner similar to that described above with reference to FIGS. 3A and 3B for the sensor sub-assembly 18 of FIG. 2.

In particular, multiple sensor sub-assemblies 70 are fabricated concurrently, as shown in FIG. 5, by punching five green ceramic sheets to form the multiple substrate layers 76, 78, 80, 82 and 84, respectively. The holes in each of the sheets which are to form the electrical conductors 86 are filled with a conductive ink. The conductive material for forming the interconnection conductor paths 86c, and for forming the lands 92 and 96, are plated on the corresponding surfaces of the ceramic sheets. An optional further conductive sealing land 106 can be plated on the sheet that forms the upper substrate layer 84.

The green ceramic sheets are then stacked, laminated and scored with score lines 108, prior to firing. The firing operation bonds the substrate layers into a single unitary structure and electrically interconnects the conductor segments of each layer to form continuous electrical conductors 86 between the upper lands 96 and the lower lands 92. The fabrication continues with the mounting of the conductor pins 94.

A subsequent fabrication step is the deposition of the bonding layer 100 on the upper surface of the substrate layer 80.

The solid-state sensing elements 74 are then positioned and bonded in place on the substrate, after which the wires 98 are bonded between the conductive lands 96 of the substrates and the contacts 74a of the sensing elements.

At this point in the fabrication, each pressure sensor sub-assembly 70 is ready for functional testing. The arrayed multiple sensor sub-assemblies can be separated from one another either prior or subsequent to the testing. The sensor sub-assemblies are separated along the score lines 108. The functional testing of each sensor sub-assembly 70 can be performed in a manner similar to that described above with reference to step 58j in FIG. 3B.

Figure 6:
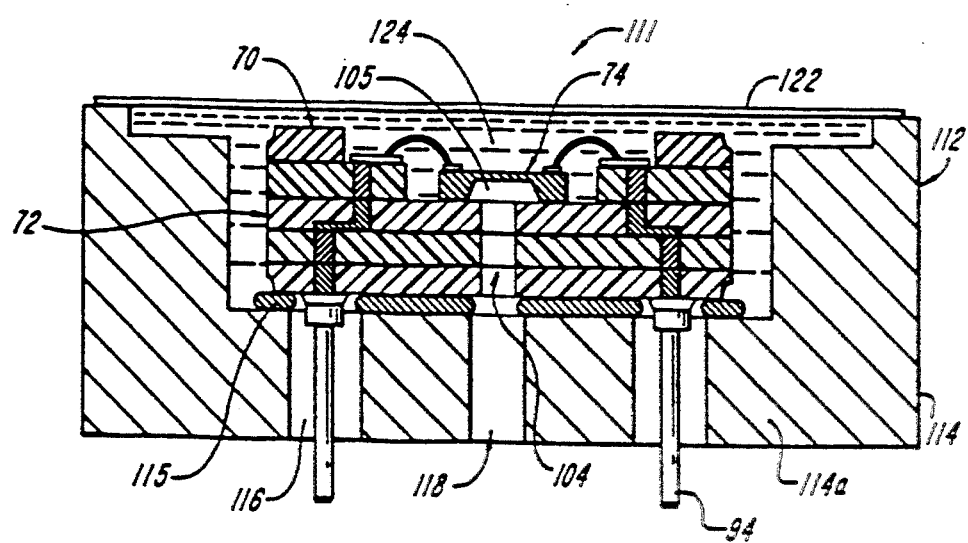
FIG. 6 is a cross-sectional view of a sensor incorporating the sensor sub-assembly of FIG. 5.

A sensor sub-assembly 70 that meets the functional test criteria is, as shown in FIG. 6, mounted in a sensor housing 112 to form a pressure sensor 111. The illustrated housing 112 has a body 114, typically of stainless steel or like material, that has a central recess. The illustrated housing body forms a housing bulkhead floor 114a on which the sensor sub-assembly 70 is mounted by way of an adhesive bond 115 that hermetically seals the lower surface of the sensor substrate 72 to the recessed top of the bulkhead floor 114a. Connector passages 116 extend through the housing bulkhead floor 114a and the sensor sub-assembly connector pins 94 extend within these openings. A pressure passage 118 through the housing floor communicates with the passage 104 and hence with the chamber 105 on one side of the diaphragm of the sensing element 74. An isolation diaphragm 122 is sealingly attached to a rim at the top of the housing body 114 and encloses a fill liquid 124 that fills the cavity that is within the housing 112 and outward of the sensor sub-assembly 70.

In one practice of the invention as described above with reference to the sensor 10 of FIG. 1 and a sensor 111 as shown in FIG. 6, the substrate is formed of the same green ceramic material used in semiconductor integrated circuit manufacturing, an example of which is available from Coors Electronics Package Company, Chattanooga, Tenn. and is designated 92% alumina ceramic, type 1 per ASTM D-24421. The solid-state sensing elements 22 and 74 for each sensor can be a silicon sensor chip as incorporated in the Series 840 Pressure Transmitter marketed by The Foxboro Company, U.S.A.; and as described in the commonly-assigned application for U.S. patent Ser. No. 676,914 filed 28 Mar. 1991 by C. Fung et al. The bonding adhesive for the layer 48 in the embodiment of FIGS. 1 and 2 and for the layer 100 in the embodiment of FIGS. 5 and 6 can be a room temperature vulcanizing rubber adhesive of the type sold by The General Electric Company under the designation fluorosilicone rubber no. FSL7210.

Further, the bonding adhesive for the layer 34 of FIG. 1 and for the layer 115 of FIG. 6, securing each sensor sub-assembly 18 and 70 to a housing body 14 and 114, respectively, can be of the type sold commercially by Ablestik Laboratories in Rancho Dominquez, Calif. under the designation Ablefilm 550—2—004.

Other specific materials and fabrication processes for the structure and for the fabrication of sensor sub-assemblies and complete sensors as described above can employ conventional practices.

It will thus be seen that the invention efficiently attains the objects set forth above. These include providing, at relatively low cost, pressure sensor apparatus and fabrication techniques for attaining a discrete, functional and testable sensor subassembly, having a laminated substrate, that can be assembled within a housing. The apparatus and method of the invention further provides high performance and rugged pressure sensor apparatus, and with efficiencies in manufacturing steps and in structural elements.

It will be understood that changes within known practices and materials may be made in the above constructions and in the foregoing steps and sequences of fabrication without departing from the scope of the invention. It is accordingly intended that all matter contained in the above description and shown in the accompanying drawings be interpreted as illustrative, and not in a limiting sense.

What is claimed as new and secured by Letters Patent is:

1. In the manufacture of pressure sensor apparatus, the steps of
   A. providing a substrate having first and second opposed sides, said substrate being laminated of at least first and second layers and having electrical conductors extending between said opposed sides in apertures through said substrate, said apertures being hermetically sealed,
   B. applying a bonding layer on said first side of said substrate,
   C. securing to said substrate electrical connector elements extending from said second side of said substrate, said connector elements being disposed for removable and replaceable connection with mating connector elements, and
   D. bonding to said first side of said substrate, by said bonding layer, a sensing element having a sensor diaphragm and electrical contacts, said sensing element developing at said electrical contacts an electrical signal in response to diaphragm deflection, and having said contacts connected electrically to said conductors.

2. In the manufacture of pressure sensor apparatus according to claim 1, the further steps of laminating said substrate of plural ceramic layers and providing said sensing element of silicon.

3. In the manufacture of pressure sensor apparatus according to claim 1, the further steps of
   A. laminating said substrate of plural ceramic layers and fabricating each said substrate layer for a plurality of sensor sub-assemblies concurrently from a sheet of unfired ceramic material by
      (i) forming apertures through said sheet and forming segments of said electrical conductors in said apertures, and
      (ii) laminating said sheets together and connecting respective ones of said conductor segments, for forming an arrayed plurality of said substrates concurrently, each with said electrical conductors extending therein, and
   B. separating said arrayed substrates into separate ones for each of the sensor sub-assemblies.

4. In the manufacture of pressure sensor apparatus according to claim 3, the further steps of
   A. stacking said sheets together and scoring said stacked layers for defining individual ones of said sensor sub-assemblies, and subsequently firing said stacked and scored sheets of unfired ceramic material, thereby for laminating said sheets together and for connecting respective conductor segments together.

5. In the manufacture of pressure sensor apparatus according to claim 1, the further steps of
   A. defining with said sensing element and said substrate a chamber between one side of the said sensing element and said substrate and wherein said sensor diaphragm of said sensing element deflects in response to the pressure difference between said chamber and the pressure on the other side of said sensing element, and
   B. providing a pressure passage through said substrate communicating with said chamber, and
   C. said step of applying said bonding layer includes maintaining said pressure passage substantially unobstructed by the material of said bonding layer.

6. In the manufacture of pressure sensor apparatus, the sequential steps of
   A. providing a ceramic substrate having first and second opposed sides, said substrate being laminated of at least first and second layers and being apertured between said first and second sides with a through pressure passage, said substrate further having electrical conductors extending between said opposed sides, said substrate being pressure-tight between said opposed sides except at said pressure passage,
   B. applying a bonding layer on said first side of said substrate,
   C. securing to said substrate electrical connector elements extending from said second side of said substrate, said connector elements being disposed for removable and replaceable connection with mating connector elements,
   D. bonding to said first side of said substrate by said bonding layer, a solid-state sensing element having a sensor diaphragm and electrical contacts, said sensing element developing at said electrical contacts an electrical signal in response to diaphragm deflection, and further having said contacts connected electrically to said conductors,
   E. testing the electrical response of said sensing element to pressure differentials between said first side and said pressure passage at the connector elements, and
   F. assembling said substrate, with said sensing element and said connector elements, within a housing.

* * * * *